US009484089B2

(12) United States Patent
Bazarsky et al.

(10) Patent No.: US 9,484,089 B2
(45) Date of Patent: Nov. 1, 2016

(54) DUAL POLARITY READ OPERATION

(71) Applicant: SANDISK TECHNOLOGIES INC., Plano, TX (US)

(72) Inventors: Alexander Bazarsky, Holon (IL); Stella Achtenberg, Netanya (IL); Eran Sharon, Rishon Lezion (IL); Ariel Navon, Revava (IL); Idan Alrod, Herzliya (IL); Tz-Yi Liu, Palo Alto, CA (US); Tianhong Yan, Saratoga, CA (US)

(73) Assignee: SANDISK TECHNOLOGIES LLC, Plano, TX (US)

( * ) Notice: Subject to any disclaimer, the term of this patent is extended or adjusted under 35 U.S.C. 154(b) by 122 days.

(21) Appl. No.: 14/518,105

(22) Filed: Oct. 20, 2014

(65) Prior Publication Data

US 2016/0111150 A1 Apr. 21, 2016

(51) Int. Cl.
*G11C 29/00* (2006.01)
*G11C 13/00* (2006.01)
*G06F 11/10* (2006.01)
*G11C 29/52* (2006.01)
*G11C 29/04* (2006.01)

(52) U.S. Cl.
CPC ......... *G11C 13/004* (2013.01); *G06F 11/1068* (2013.01); *G11C 13/0002* (2013.01); *G11C 29/52* (2013.01); *G11C 2013/0054* (2013.01); *G11C 2029/0411* (2013.01); *G11C 2213/71* (2013.01)

(58) Field of Classification Search
CPC combination set(s) only.
See application file for complete search history.

(56) References Cited

U.S. PATENT DOCUMENTS

| 6,842,375 | B1 | 1/2005 | Raszka | |
|---|---|---|---|---|
| 7,130,213 | B1 | 10/2006 | Raszka | |
| 7,180,772 | B2 | 2/2007 | Rinerson et al. | |
| 2011/0209031 | A1* | 8/2011 | Kim | G06F 11/1048 714/763 |
| 2012/0140560 | A1* | 6/2012 | Yang | G11C 11/5642 365/185.18 |
| 2013/0024743 | A1* | 1/2013 | Sharon | G06F 11/1072 714/763 |
| 2013/0073924 | A1* | 3/2013 | D'Abreu | G06F 11/1048 714/763 |
| 2013/0173985 | A1* | 7/2013 | Chung | H03M 13/1111 714/755 |
| 2013/0194883 | A1* | 8/2013 | Lee | G11C 29/04 365/201 |
| 2013/0343131 | A1* | 12/2013 | Wu | G11C 16/26 365/185.24 |
| 2014/0056068 | A1* | 2/2014 | Strasser | G06F 11/1048 365/185.03 |
| 2014/0140148 | A1* | 5/2014 | An | G11C 11/5642 365/189.14 |
| 2014/0149826 | A1* | 5/2014 | Lu | G06F 11/108 714/764 |
| 2014/0233299 | A1 | 8/2014 | Lan et al. | |
| 2014/0235029 | A1 | 8/2014 | Chiang | |
| 2014/0281771 | A1* | 9/2014 | Yoon | G06F 11/1068 714/721 |
| 2014/0372674 | A1* | 12/2014 | Kim | G06F 12/0246 711/103 |
| 2015/0019934 | A1* | 1/2015 | Chae | G06F 11/1048 714/764 |
| 2015/0113322 | A1* | 4/2015 | Lee | G11C 7/14 714/15 |
| 2015/0117125 | A1* | 4/2015 | Choi | G11C 7/02 365/189.15 |
| 2015/0200688 | A1* | 7/2015 | Pan | H03M 13/3927 714/794 |

* cited by examiner

Primary Examiner — Guerrier Merant
(74) Attorney, Agent, or Firm — Toler Law Group, PC

(57) ABSTRACT

A data storage device includes a memory die and a controller coupled to the memory die. The memory die includes a resistive memory and read/write circuitry configured to determine a first hard bit value and a second hard bit value of a storage element of the resistive memory. The first hard bit value and the second hard bit value are determined using opposite polarity read voltages. The controller is configured to perform error correction with respect to data read from the resistive memory.

20 Claims, 5 Drawing Sheets

502
At a data storage device that includes a memory die including a resistive memory, perform a first read operation with respect to a storage element of the resistive memory to determine a first read bit value of the storage element, where performing the first read operation includes applying a first read voltage having a first polarity

504
Perform a second read operation with respect to the storage element to determine a second read bit value of the storage element, where performing the second read operation includes applying a second read voltage having a second polarity opposite the first polarity

506
Determine read confidence information associated with the storage element based on at least one of the first read operation or the second read operation

FIG. 5

DUAL POLARITY READ OPERATION

FIELD OF THE DISCLOSURE

The present disclosure is generally related to reading data from a data storage device.

BACKGROUND

Non-volatile data storage devices have enabled increased portability of data and software applications. As research and development in the field of data storage devices progresses, data storage devices are becoming configured to store increasingly large amounts of data in smaller areas. As data storage density increases, error rates of stored data may also increase (e.g., due to noise and other factors).

One type of memory that can be incorporated into a data storage device is resistive random access memory (ReRAM). In ReRAM, a memory cell can be read by applying a read voltage to the memory cell and measuring a current through the memory cell. When the memory cell is in a low resistance state, the measured current is large and the memory cell is determined to store a first logical value. When the memory cell is in a high resistance state, the measured current is low and the memory cell is determined to store a second logical value. In some situations, the memory cell may be read erroneously. For example, noise or interference from neighboring memory cells may cause an erroneous read.

SUMMARY

Storage elements (e.g., memory cells) of a resistive memory (e.g., ReRAM) are typically read by applying read voltage in a single direction (e.g., positive polarity). In contrast, the present disclosure utilizes a read voltage that may be applied in both directions (e.g., positive and negative polarities) to determine a value stored in a ReRAM storage element. For example, both polarities may be used to read a resistive memory storage element because an absolute value of a current or a resistance associated with the storage element may be sufficient to sense the logical value stored in the storage element. By applying the read voltage in both directions, additional information about the state of the storage element may be determined, which may make the read operation more tolerant to noise/interference and may enable improved error correction capability in a data storage device.

To illustrate, a positive read voltage may be applied to determine a first read bit value of the storage element. The first read bit value may also be referred to as a first "hard" bit value. A negative read voltage (e.g., having the same magnitude but opposite polarity to the positive read voltage) may be applied to determine a second hard bit value. When the first and second hard bit values match, the read operation of the storage element may be deemed as "high confidence." When the first and second hard bit values do not match, the read operation may be deemed as "low" confidence. Read confidence information may also be determined by comparing the measured current/resistance of the storage element to multiple thresholds. The read confidence information may be represented as one or more "soft" bit values. An error correction code (ECC) engine of the data storage device may take the soft bit value(s) into account when performing error correction. For example, the ECC engine may determine a log likelihood ratio (LLR), for use during error correction, based on the soft bit value(s).

BRIEF DESCRIPTION OF THE DRAWINGS

FIG. 2 is a block diagram of a second illustrative embodiment of a system that includes a data storage device configured to perform a dual polarity read operation;

FIG. 5 is a flow diagram of an illustrative method of performing a dual polarity read operation.

DETAILED DESCRIPTION

Particular embodiments of the present disclosure are described with reference to the drawings. In the description, common features are designated by common reference numbers throughout the drawings.

Figure 1:
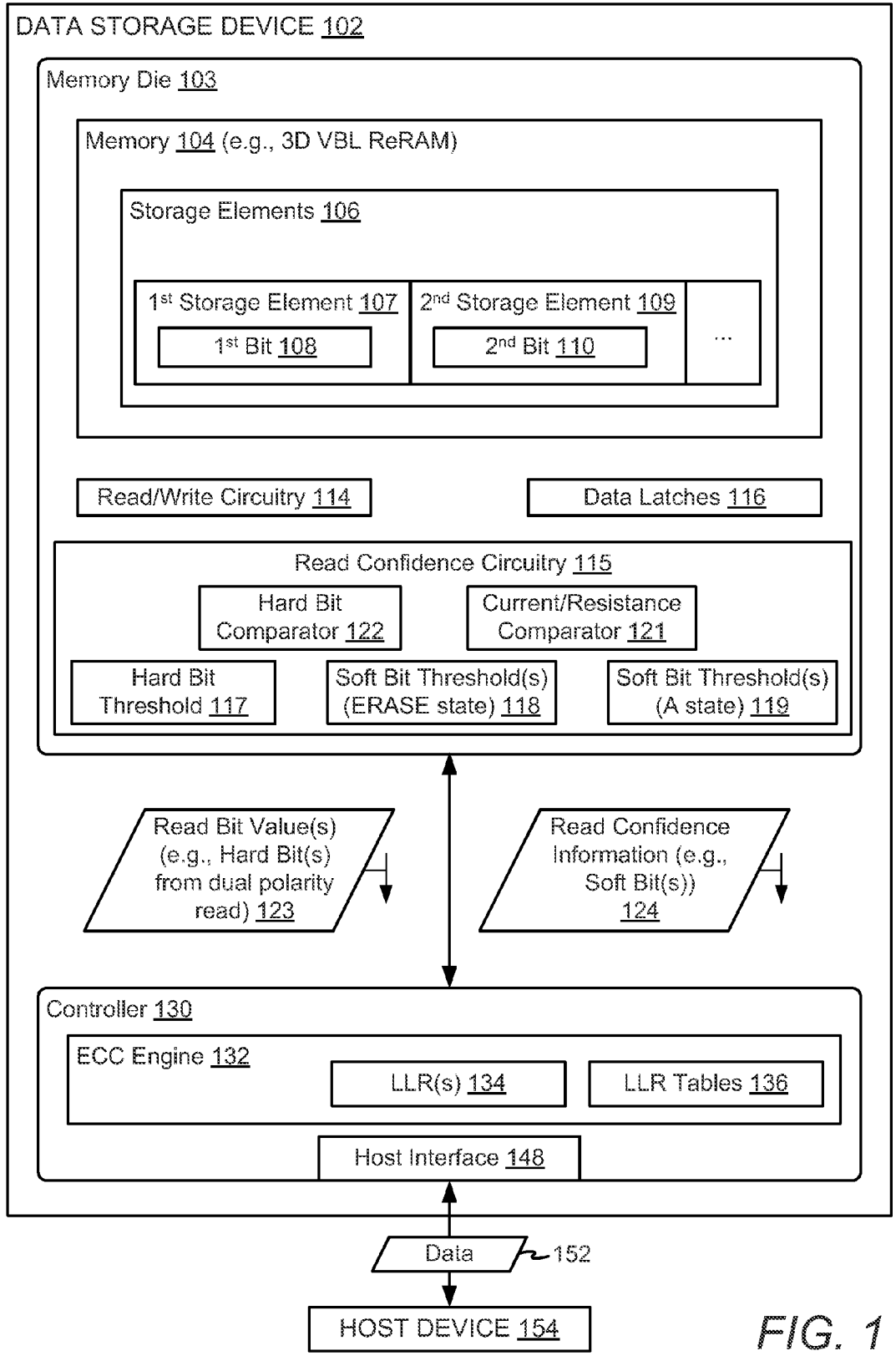
FIG. 1 is a block diagram of a first illustrative embodiment of a system that includes a data storage device configured to perform a dual polarity read operation.

Referring to FIG. 1, an illustrative example of a system is depicted and generally designated 100. The system 100 includes a data storage device 102 and a host device 154. The data storage device 102 and the host device 154 may be operationally coupled via a connection, such as a bus or a wireless connection. The data storage device 102 may be embedded within the host device 154, such as in accordance with a Joint Electron Devices Engineering Council (JEDEC) Solid State Technology Association Universal Flash Storage (UFS) configuration. Alternatively, the data storage device 102 may be removable from the host device 154 (i.e., "removably" coupled to the host device 154). As an example, the data storage device 102 may be removably coupled to the host device 154 in accordance with a removable universal serial bus (USB) configuration.

The data storage device 102 includes a memory die 103 and a controller 130. The memory die 103 and the controller 130 may be coupled via one or more buses, one or more interfaces, and/or another structure. An interface may be wired (e.g., a bus structure) or wireless (e.g., a wireless communication interface).

The memory die 103 includes a memory 104 (e.g., a non-volatile memory), read/write circuitry 114, data latches 116, and read confidence circuitry 115. In a particular embodiment, the memory 104 includes a resistive memory. For example, the resistive memory may include resistive random access memory (ReRAM), flash memory (e.g., NOR flash or NAND flash), magnetic random access memory (MRAM), and/or another type of resistive memory. The memory 104 may have a three-dimensional (3D) memory configuration, such as a vertical bit line (VBL) 3D architecture. For example, the memory 104 may include 3D VBL ReRAM. In a particular implementation, the memory 104 is a non-volatile memory having a 3D memory configuration that is monolithically formed in one or more physical levels of arrays of memory cells having an active area disposed above a silicon substrate, and the memory die 103 includes circuitry associated with operation of the memory cells (e.g., including but not limited to the read/write circuitry 114, the data latches 116, and read confidence circuitry 115). Alternatively, the memory 104 may have another configuration, such as a two-dimensional (2D) memory configuration or a stacked 2D memory configuration.

The memory 104 may include storage elements 106 (e.g., memory cells) and a plurality of bit lines and word lines connecting the storage elements 106. In FIG. 1, the memory 104 includes an illustrative first storage element 107 and a second storage element 109. The first storage element 107 stores a first bit 108 and the second storage element 109 stores a second bit 110. The first storage element 107 and the second storage element 109 may be adjacent. For example, the first storage element 107 and the second storage element 109 may be adjacent storage elements of a plurality of storage elements that corresponds to a row of a memory array. Thus, the first storage element 107 and the second storage element 109 may be addressed using a common word line but different bit lines.

The controller 130 may include an error correcting code (ECC) engine 132 and a host interface 148. The ECC engine 132 is configured to receive data and to generate one or more ECC codewords based on the data. The ECC engine 132 may include a Hamming encoder, a Reed-Solomon (RS) encoder, a Bose-Chaudhuri-Hocquenghem (BCH) encoder, a low-density parity check (LDPC) encoder, a turbo encoder, an encoder configured to encode data according to one or more other ECC schemes, or a combination thereof. The ECC engine 132 is also configured to perform error correction with respect to data read from the memory 104. For example, the ECC engine 132 may be configured to decode data accessed from the memory 104 to detect and correct one or more bit errors that may be present in the data, up to an error correcting capacity of the ECC engine 132.

The controller 130 is configured to receive data and instructions from the host device 154 and to send data to the host device 154. For example, the controller 130 may receive data from the host device 154 via the host interface 148 and may send data to the host device 154 via the host interface 148. The controller 130 is configured to send data and commands to the memory 104 and to receive data from the memory 104. For example, the controller 130 is configured to send data and a write command to cause the memory 104 to store data to a specified address of the memory 104. The write command may specify a physical address of a portion of the memory 104 (e.g., a physical address of a word line of the memory 104) that is to store the data. The controller 130 is configured to send a read command to the memory 104 to access data from a specified address of the memory 104. The read command may specify the physical address of a portion of the memory 104 (e.g., a physical address of a word line of the memory 104).

The host device 154 may correspond to a mobile telephone, a computer (e.g., a laptop, a tablet, or a notebook computer), a music player, a video player, a gaming device or console, an electronic book reader, a personal digital assistant (PDA), a portable navigation device, another electronic device, or a combination thereof. The host device 154 may communicate via a host controller, which may enable the host device 154 to communicate with the data storage device 102. The host device 154 may operate in compliance with a JEDEC Solid State Technology Association industry specification, such as an embedded MultiMedia Card (eMMC) specification or a Universal Flash Storage (UFS) Host Controller Interface specification. The host device 154 may operate in compliance with one or more other specifications, such as a Secure Digital (SD) Host Controller specification as an illustrative example. Alternatively, the host device 154 may communicate with the data storage device 102 in accordance with another communication protocol.

During operation, the controller 130 may receive data 152 and a request for write access to the memory 104 from the host device 154 via the host interface 148. The data 152 may correspond to a data file (e.g., an image file, an audio file, or a video file, as illustrative examples). The controller 130 may provide the data 152 to the ECC engine 132 to generate one or more ECC codewords based on the data 152. The controller 130 may initiate one or more operations to write the one or more ECC codewords to the memory 104. For example, the controller 130 may write the one or more ECC codewords into the data latches 116 and send the memory die 103 a write command. The read/write circuitry 114 may retrieve the one or more ECC codewords from the data latches 116 and write the one or more ECC codewords into the memory 104. For example, a first bit of the ECC codewords may be written to the first storage element 107 (as the first bit 108) and a second bit of the ECC codewords may be written to the second storage element 109 (as the second bit 110).

When the memory 104 is a resistive memory, a resistance state of a storage element may represent the bit stored by the storage element. For example, each storage element of the memory 104 may be programmed to have one of multiple resistance states. A first of the states may be an "ERASE" state and a second of the states may be an "A" state. The ERASE state may correspond to a first logical value (e.g., 1) and the A state may correspond to a second logical value (e.g., 0). In alternative embodiments, the storage element may have more than two possible resistance states. For example, if a storage element stores two bits, the storage element may have four possible resistance states: ERASE (corresponding to 00), A (corresponding to 01), B (corresponding to 10), and C (corresponding to 11).

The controller 130 may also receive a request for read access to the memory 104 from the host device 154 via the host interface 148. The request may include an address of requested data, such as an address of the first storage element 107, an address of the second storage element 109, a word line address, etc. The controller 130 may send the memory die 103 a read command, causing the read/write circuitry 114 to read the first bit 108 stored in the first storage element 107. For example, the read/write circuitry 114 may perform a first read operation with respect to the first storage element 107 to determine a first read bit value, alternatively referred to as a "hard" bit value. The first read operation may be performed by applying a read voltage having a first polarity. To illustrate, the first read operation may be performed using a positive read voltage. The read/write circuitry 114 may also perform a second read operation with respect to the first storage element 107 to determine a second hard bit value, including applying the read voltage having a second polarity that is opposite the first polarity. To illustrate, the second read operation may be performed using a negative read voltage. Different magnitude of read voltage may be used in different embodiments. Further, the read voltage magnitude may be approximately the same or may be different for positive polarity reads than for negative polarity reads. In some embodiments, a negative polarity read may be performed prior to the positive polarity read. The read/write circuitry 114 may use the same power supply and/or sense circuitry (e.g., sense amplifiers) for the positive polarity read and the negative polarity read. For example, one or more transistors may be used to "route" the read voltage in the positive or negative direction. Alternatively, a different power supply and/or different sense circuitry may be used for the positive polarity read than for the negative polarity read.

Both of the hard bit values of the first storage element 107 may be provided to read confidence circuitry 115. The read confidence circuitry 115 may determine read confidence information 124 associated with the first storage element 107. The read confidence information 124 may provide an indication of a reliability of reading the first storage element 107.

For example, the read confidence information may include a "soft" bit value that indicates whether the first hard bit value matches the second hard bit value. To illustrate, the soft bit value may be determined by comparing the hard bit values using a hard bit comparator 122. In a particular embodiment, the hard bit comparator corresponds to a logical exclusive or (XOR) operation. That is, the soft bit value may be determined by SB=HB+ XOR HB− where SB is the soft bit value, HB+ is the hard bit value determined from the positive polarity read, and HB− is the hard bit value determined from the negative polarity read. When the hard bit values match, SB=0, indicating high read confidence. When the hard bit values do not match, SB=1, indicating low read confidence. Reasons that the hard bit values may not match include, but are not limited to, noise factors, interference, read disturb, and read or write hardware errors.

The read confidence circuitry 115 may provide the read confidence information 124 and one or both hard bit values for the first storage element 107 (shown in FIG. 1 as read bit value(s) 123) to the controller 130, as shown. Although the aforementioned dual polarity read operation is described in the context of reading a single storage element (e.g., the first storage element 107), the present disclosure is not so limited. A dual polarity read operation may be performed concurrently for a plurality of storage elements of the memory 104. For example, the first storage element 107 and the second storage element 109 may be part of a plurality of storage elements that stores a representation of an ECC codeword. The ECC codeword may include at least one bit error. The read/write circuitry 114 may perform positive and negative polarity reads of the storage elements 107 and 109, and the read confidence circuitry 115 may provide the controller 130 the read bit values 123 (e.g., hard bits) and the read confidence information 124 (e.g., soft bits) corresponding to each of the plurality of storage elements.

The ECC engine 132 may take the read confidence information into account when correcting the at least one bit error in the ECC codeword. To illustrate, the ECC engine 132 may determine log likelihood ratios (LLRs) 134 corresponding to the first storage element 107 and corresponding to the second storage element 109. LLRs may be used by the ECC engine 132 to perform error correction, and the ECC engine 132 may store LLR tables 136 that are used during the error correction. For example, the LLR tables 136 may include entries for the LLRs 134 that are determined from soft bit values. A LLR may be a numeric value that indicates both hard bit information as well as soft bit information. In a particular embodiment, a sign of a LLR indicates hard bit information and a magnitude of the LLR indicates reliability, as illustrated by Table 1 below. In alternative embodiments, different LLRs may be mapped to different hard bit/soft bit combinations.

TABLE 1

| HB+ | HB− | SB = HB+ XOR HB− | LLR |
|-----|-----|------------------|-----|
| 0   | 0   | 0                | −13 |
| 0   | 1   | 1                | −3  |
| 1   | 0   | 1                | +3  |
| 1   | 1   | 1                | +13 |

The ECC engine 132 may correct bit error(s) in ECC codeword(s) read from the memory 104 and provide the resulting corrected data 152 to the host device 154 via the host interface 148. By using information from both positive and negative polarity reads, the data storage device 102 may provide increased tolerance to noise factors, interference, and other error-causing conditions.

In alternative embodiments, more than one soft bit may be generated for each storage element. Soft bits may also be generated without comparing hard bits. To illustrate, reading a storage element may include applying a (positive or negative) read voltage. The read voltage may cause a (positive or negative) current through the storage element. A magnitude of the current may be compared to a hard bit threshold 117. When the current magnitude is less than the hard bit threshold 117, the storage element may be determined to be in a first state, such as ERASE (or A). Otherwise, the storage element may be determined to be in a second state, such as A (or ERASE). In alternative embodiments, a resistance of the storage element may be measured, and resistance thresholds may be used instead of current thresholds. Accordingly, the read confidence circuitry 115 may include a current/resistance comparator 121 (e.g., a sense amplifier circuit) to determine soft bit values.

Figure 3:
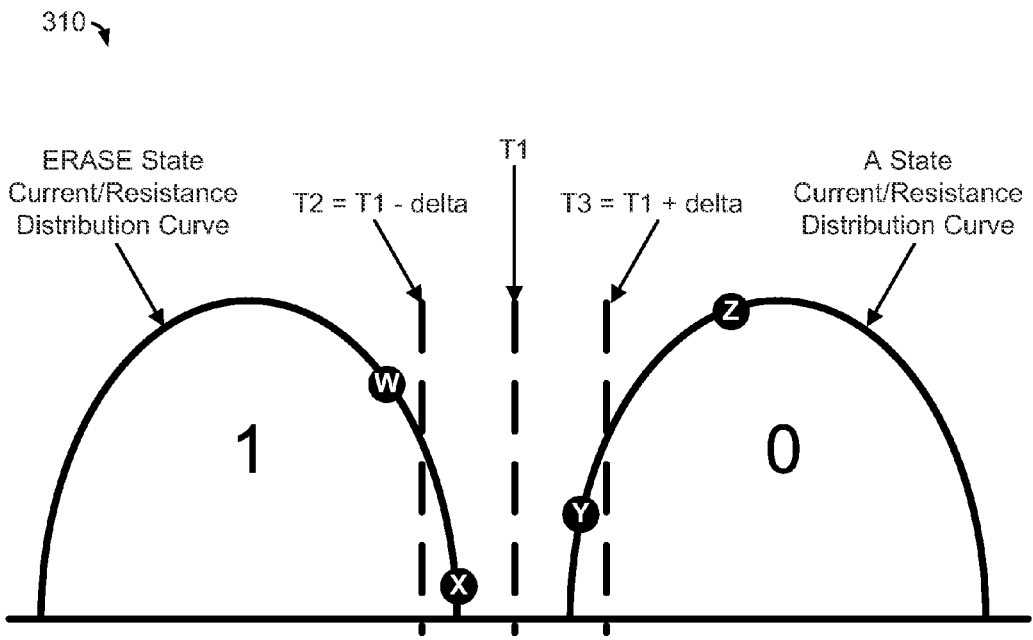
FIG. 3 illustrates examples of thresholds that may be used to determine read confidence information.
Figure 3:
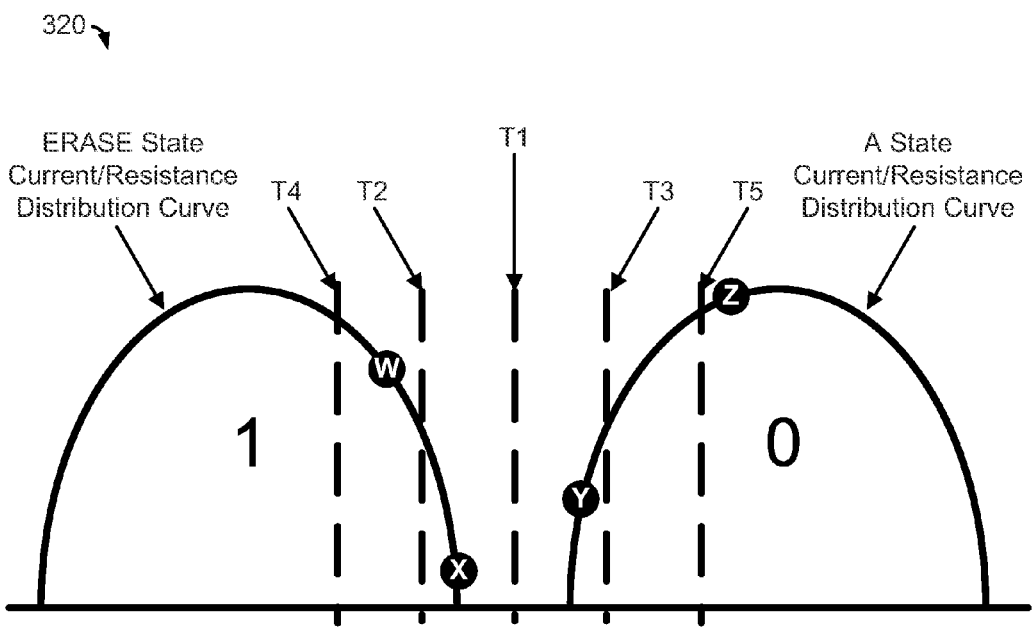

To illustrate, referring to FIG. 3, examples of thresholds that may be used to determine hard bits and soft bits are shown. In a first diagram 310, the hard bit threshold 117 is denoted "T1." T1 corresponds to a midpoint between an ERASE state distribution curve and an A state distribution curve. The distribution curves may be theoretical or empirically measured curves corresponding to possible current/resistance measurements of storage elements of the memory 104. When a storage element is in the ERASE state (e.g., storing a 1), the current or resistance of the storage element may be represented by a point on the ERASE state distribution curve. When a storage element is in the A state (e.g., storing a 0), the current or resistance of the storage element may be represented by a point on the A state distribution curve. Accordingly, in the example of FIG. 3, the hard bit for storage elements "W" and "X" is 1 and the hard bit for storage elements "Y" and "Z" is 0. Hard bit values HB+ and HB− may be determined by comparing the current or resistance measured during a positive polarity read and a negative polarity read, respectively, to the hard bit threshold (T1) 117.

Soft bit values may be determined by comparing a property of the storage element (e.g., the current or the resistance of the storage element) to additional thresholds. For example, a second threshold "T2" may be within the ERASE state curve and a third threshold "T3" may be within the A state curve. T2 and T3 may differ from T1 by an offset "delta." A first value S1 may be determined by comparing the property to the second threshold and a second value S2 may be determined by comparing the current or resistance to the third threshold. A soft bit SB may be determined by comparing S1 and S2 using an exclusive or (e.g., SB=S1 XOR S2) or an exclusive nor (e.g., S1 NXNOR S2).

Like the hard bits HB+ and HB−, soft bits may also be sensed in both polarities. To illustrate, a soft bit SB+ may be determined from the positive polarity sensing and a soft bit SB− may be determined from the negative polarity sensing. Additional soft bits may also be generated using additional thresholds. For example, as shown in a second diagram 320 of FIG. 3, a fourth threshold T4 and a fifth threshold T5 may be used. In the example of FIG. 3, the current (or resistance) for the Z storage element is greater than T5 but the current (or resistance) for the W storage element is not less than T4. Thus, a read confidence for the Z storage element may be higher than a read confidence for the W storage element, because the Z storage element may be determined as storing a "stronger" 0, whereas the W storage element may be determined as storing a "weaker" 1. T2 and T4 are illustrated in FIG. 1 as ERASE state thresholds 118. T3 and T5 are illustrated in FIG. 1 as A state thresholds 119.

Thus, multiple soft bit values may be generated during a dual polarity read operation as described herein. To illustrate, SB1+ and SB1− may be determined from positive and negative polarity reads using a first pair of thresholds (e.g., T2 and T3). SB2+ and SB2− may be determined from positive and negative polarity reads using a second pair of thresholds (e.g., T4 and T5). The soft bit values may be combined using logical operators (e.g., SB1=SB1+ XOR SB1−, and SB2=SB2+ XOR SB2−).

Another method of determining soft bit information may include repeating each measurement/sensing operation (e.g., for the thresholds 117-119) several times. Results of the repeated operations may be averaged, or differing results may be used to determine additional soft bits.

Figure 2:
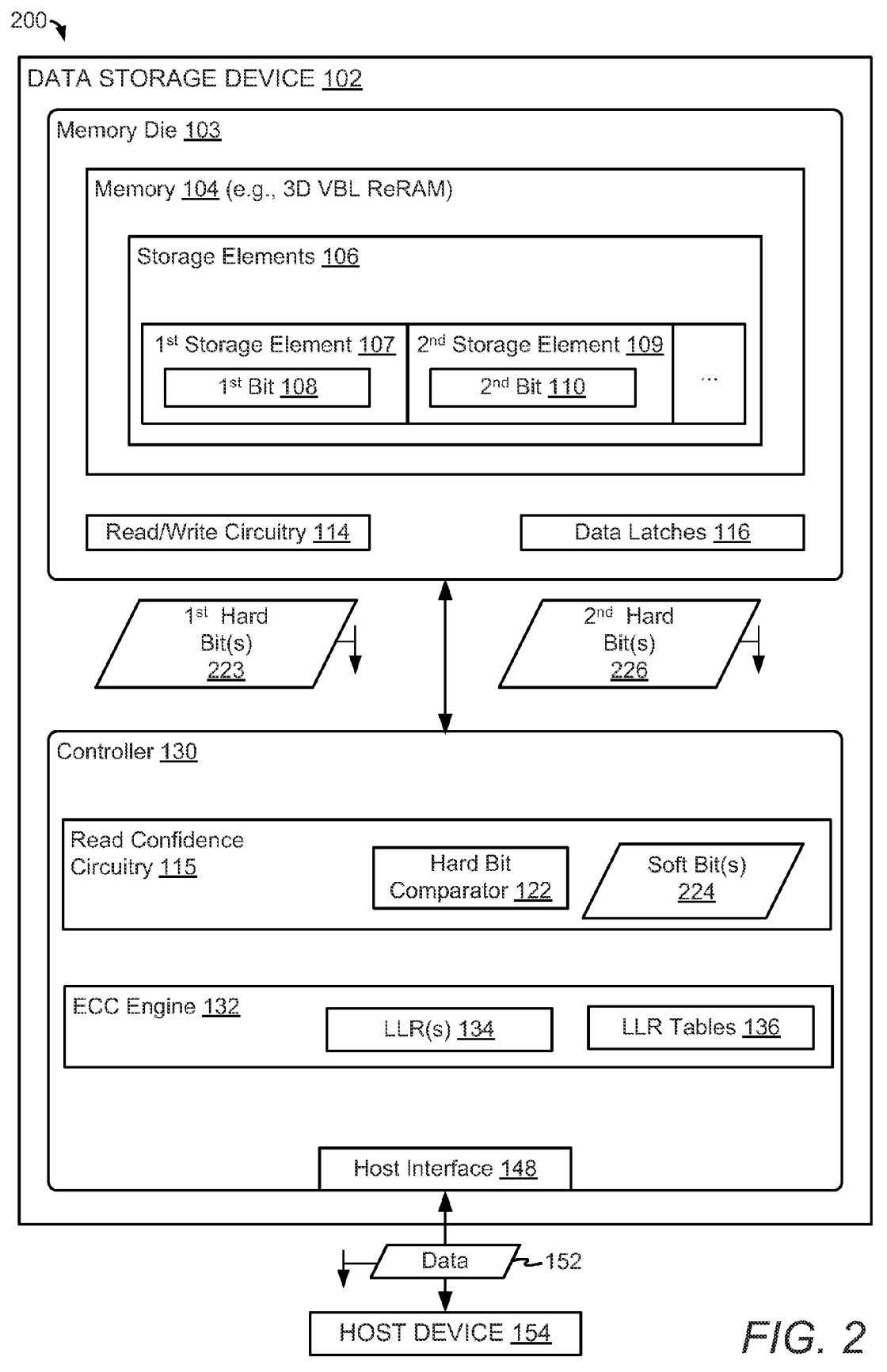

Whereas FIG. 1 illustrates a system in which the memory die 103 determines and provides read confidence information (e.g., soft bits) to the controller 130, FIG. 2 illustrates an alternative system 200 in which the controller determines the read confidence information. In FIG. 2, the memory die 103 provides first hard bit(s) 223 and second hard bit(s) 226 to the controller 130. To illustrate, the first hard bit(s) 223 may correspond to a positive polarity read of storage element(s) of the memory 104 and the second hard bit(s) 226 may correspond to a negative polarity read of the storage element(s) of the memory 104.

The read confidence circuitry 115 may be included in the controller 130. In an illustrative embodiment, the hard bit comparator 122 of the read confidence circuitry 115 compares the hard bit(s) 223, 226 to generate soft bit(s) 224. In alternative embodiments, the soft bit(s) 224 may be generated based on one or more current/resistance thresholds, as described with reference to FIG. 3. The soft bit(s) 224 may be provided to the ECC engine 132, which may determine LLR(s) based on the soft bit(s) 224 and use the LLRs during error correction. As an illustrative non-limiting example, bits of an ECC codeword having low confidence LLRs may be more likely to be erroneous, and the ECC engine 132 may attempt to flip such bits earlier during error correction.

FIGS. 1-3 thus illustrate embodiments in which the data storage device 102 is configured to perform dual polarity read operations. Using information from both positive and negative polarity reads may provide additional read reliability information (e.g., soft bits) as compared to only using a single polarity read voltage during a read operation. The additional soft bits may improve data storage reliability of a memory by increasing tolerance to noise factors and interference.

Figure 4:
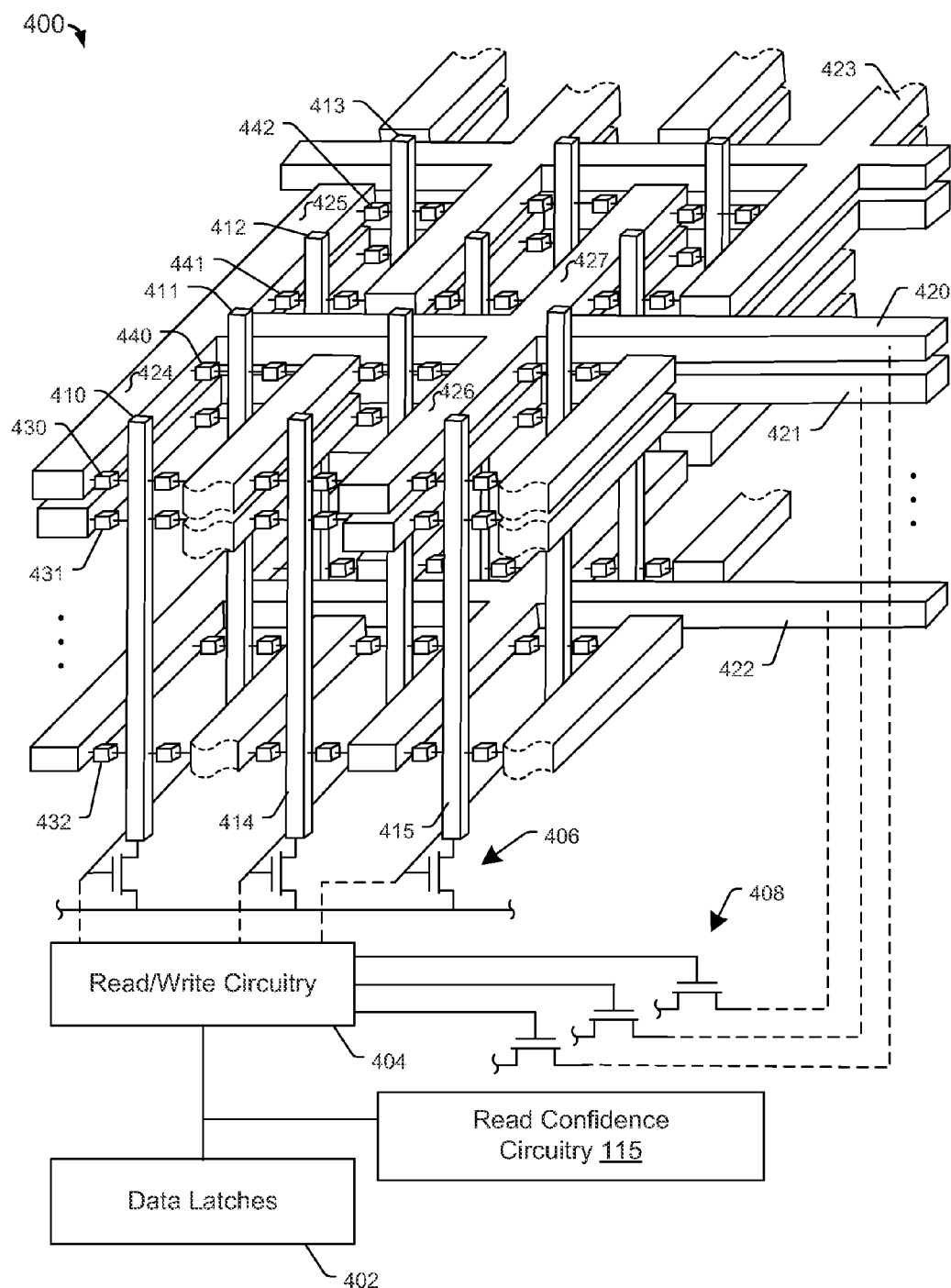
FIG. 4 is a diagram of a portion of an illustrative embodiment of a memory die that may be included in the data storage device of FIG. 1.

FIG. 4 is a diagram of a particular embodiment of a memory die including a memory 400. The memory 400 may be included in the data storage device 102 of FIGS. 1-2. In the embodiment illustrated in FIG. 4, the memory 400 is a vertical bit line (VBL) Resistive Random Access Memory (ReRAM). For example, the memory 400 may correspond to the memory 104 of FIGS. 1-2.

The memory 400 includes a plurality of conductive lines in physical layers over a substrate (e.g., substantially parallel to a surface of the substrate), such as representative word lines 420, 421, 422, and 423 (only a portion of which is shown in FIG. 4) and a plurality of vertical conductive lines through the physical layers, such as representative bit lines 410, 411, 412, and 413. The word line 422 may include or correspond to a first group of physical layers and the word lines 420, 421 may include or correspond to a second group of physical layers. The memory 400 also includes a plurality of resistance-based storage elements (e.g., memory cells), such as representative storage elements 430, 431, 432, 440, 441, and 442, each of which is coupled to a bit line and a word line in arrays of memory cells in multiple physical layers over the substrate (e.g., a silicon substrate).

The memory 400 also includes read/write circuitry 404, such as the read/write circuitry 114 of FIGS. 1-2. The read/write circuitry 404 is coupled to word line drivers 408 and to bit line drivers 406. The read/write circuitry 404 may also be coupled to data latches 402 (e.g., the data latches 116 of FIGS. 1-2) and to the read confidence circuitry 115 of FIG. 1.

In the embodiment illustrated in FIG. 4, each of the word lines includes a plurality of fingers (e.g., a first word line 420 includes fingers 424, 425, 426, and 427). Each finger may be coupled to more than one bit line. To illustrate, a first finger 424 of the first word line 420 is coupled to a first bit line 410 via a first storage element 430 at a first end of the first finger 424, and the first finger 424 is coupled to a second bit line 411 via a second storage element 440 at a second end of the first finger 424. The first storage element 430 may correspond to the first storage element 107 of FIG. 1 and the second storage element 440 may correspond to the second storage element 109 of FIG. 1.

In the embodiment illustrated in FIG. 4, each bit line may be coupled to more than one word line. To illustrate, the first bit line 410 is coupled to the first word line 420 via the first storage element 430 and the first bit line 410 is coupled to a third word line 422 via a third storage element 432.

During a write operation, the controller 130 may receive data from a host device, such as the host device 154 of FIG. 1. The controller 130 may send the data (or a representation of the data) to a memory die that includes the memory 400. The controller 130 may encode the data prior to sending the encoded data to the memory die.

The read/write circuitry 404 may write data to storage elements corresponding to a destination of the data. For example, the read/write circuitry 404 may apply selection signals to selection control lines coupled to the word line drivers 408 and to the bit line drivers 406 to cause a write voltage to be applied across a selected storage element. For example, to select the first storage element 430, the read/write circuitry 404 may activate the word line drivers 408 and the bit line drivers 406 to drive a programming current (also referred to as a write current) through the first storage element 430. To illustrate, a first write current may be used to write a first logical value (e.g., a value corresponding to a high-resistance state) to the first storage element 430, and a second write current may be used to write a second logical value (e.g., a value corresponding to a low-resistance state) to the first storage element 430. The programming current may be applied by generating a programming voltage across the first storage element 430, by applying a first voltage to the first bit line 410 and to word lines other than the first word line 420, and by applying a second voltage to the first word line 420. In a particular embodiment, the first voltage is applied to other bit lines (e.g., the bit lines 414, 415) to reduce leakage current in the memory 400.

During a read operation, the read/write circuitry 404 may read bits from particular storage elements of the memory 400 by applying selection signals to selection control lines coupled to the word line drivers 408 and to the bit line drivers 406 to cause a read voltage to be applied across a selected storage element. For example, to select the first storage element 430, the read/write circuitry 404 may activate the word line drivers 408 and the bit line drivers 406 to apply a first voltage to the first bit line 410 and to word lines other than the first word line 420. A lower voltage may be applied to the first word line 420. Thus, a read voltage is applied across the first storage element 430, and a read current corresponding to the read voltage may be detected at a sense amplifier of the read/write circuitry 404. The read current corresponds (via Ohm's law) to a resistance state of the first storage element 430, which corresponds to a logical value stored at the first storage element 430. During the read operation, the read/write circuitry 404 may cause the read voltage to be applied with positive polarity to generate a first hard bit value, and may then cause the read voltage to be applied with negative polarity to generate a second hard bit value. In a particular embodiment, the read/write circuitry 404 may wait for a period of time (e.g., a programmable duration of time or a fixed setting time) between completing the positive polarity read and initiating the negative polarity read. In alternative embodiments, the negative polarity read may be performed prior to the positive polarity read. The hard bit values may be provided to the read confidence circuitry 115, which may generate one or more soft bit values based on the hard bit values, as described with reference to FIGS. 1-3.

In a particular embodiment, the read/write circuitry 404 performs dual polarity reads during each read operation of each storage element. Alternatively, dual polarity reading may be selectively enabled and disabled. For example, dual polarity reads may be enabled (memory-wide, on a per-region basis, or on a per-storage element basis) in response to a determination at a memory die (e.g., the memory die 103) and/or a controller (e.g., the controller 130). To illustrate, dual polarity reads may be enabled and/or performed in response to detecting a high number of errors (e.g., greater than a threshold number of read errors), memory wear (e.g., greater than a threshold number of memory program/erase cycles), etc. Thus, the memory die and/or controller may maintain a count of read errors and program/erase cycles, and may store thresholds that are compared to the count of read errors and to the count of program/erase cycles. In an illustrative embodiment, a command or instruction issued by a host device or by a controller may indicate whether a single polarity read or a dual polarity read is to be performed.

Referring to FIG. 5, an illustrative embodiment of a method of performing dual polarity reads is depicted and generally designated 500. The method 500 may be performed at a data storage device, such as the data storage device 102 of FIG. 1 or FIG. 2. The data storage device may include a memory die (e.g., the memory die 103). The memory die may include a resistive memory (e.g., the memory 104).

The method 500 may include performing a first read operation with respect to a storage element of the resistive memory to determine a first read bit value of the storage element, at 502. Performing the first read operation may include applying a first read voltage having a first polarity. For example, the read/write circuitry 114 may determine a first hard bit value of the first storage element 107, the first hard bit value indicating whether the first bit 108 is sensed as a 0 or a 1.

The method 500 may also include performing a second read operation with respect to the storage element to determine a second read bit value of the storage element, at 504. Performing the second read operation may include applying a second read voltage having a second polarity that is opposite the first polarity. For example, the read/write circuitry 114 may determine a second hard bit value of the first storage element 107, the second hard bit value indicating whether the first bit 108 is sensed as a 0 or a 1. The magnitudes of the first read voltage and the second read voltage may be approximately the same or may be different.

The method 500 may further include determining read confidence information associated with the storage element, at 506. The read confidence information may be based on at least one of the first read operation or the second read operation. To illustrate, a soft bit value and/or a LLR may be determined based on XORing the hard bit values, as shown in Table 1. As another example, multiple soft bit values may be generated as described with reference to the ERASE state thresholds 118 and the A state thresholds 119, as illustrated in FIG. 3.

It should be noted that one or more operations of the method 500 may be performed concurrently. For example, the read operation using the first read voltage, at 502, may be concurrently for multiple storage elements that collectively store a representation of an ECC codeword. The read operation using the first read voltage, at 502, may also be concurrently performed for the multiple storage elements. Further, the read confidence information may be concurrently determined, at 506, for each of the multiple storage elements.

One or more portions of the method 500 may be performed at the memory die 103 or the controller 130. In one example, hard bit values and soft bit values may be determined at the memory die 103 and provided to the controller 130, as described with reference to FIG. 1. As another example, the memory die 103 may provide the hard bit values to the controller 130, and the controller 130 may determine the soft bit/LLR values, as described with reference to FIG. 2.

The method 500 may enable dual polarity read operation in a resistive memory. Performing reads using both positive and negative polarity read voltage may provide additional information for the generation of soft bits. Generating and using the additional soft bits may improve data storage reliability of the memory by increasing tolerance to noise factors and interference, including noise factors and interference in a resistive memory having a 3D memory configuration, such as a 3D ReRAM. For example, because a 3D ReRAM may include more pairs of adjacent storage elements as compared to a planar memory configuration, noise factors or interference may occur more frequently. Hence, the method 500 may enable improved reliability of a memory, such as a memory having a 3D ReRAM configuration.

Although certain examples have been provided for illustration, it should be appreciated that certain modifications or substitutions may be made to such examples without departing from the disclosure. It is also noted that certain characteristics of the data storage device 102 may be modified (e.g., updated) using a firmware update or other update. As an illustrative non-limiting example, as the data storage device 102 is operated, physical characteristics of the data storage device 102 may change (e.g., storage elements of the memory 104 may undergo physical degradation or wear). In this case, dual polarity reading may be enabled, the hard bit threshold 117 and the soft bit thresholds 118-119 may be modified, etc. (e.g., via a firmware update).

Although the controller 130 and certain other components described herein are illustrated as block components and described in general terms, such components may include one or more microprocessors, state machines, and/or other circuits configured to enable the data storage device 102 (or one or more components thereof) to perform operations described herein. One or more components described herein may be operationally coupled using one or more nodes, one or more buses (e.g., data buses and/or control buses), one or more other structures, or a combination thereof. One or more components described herein may include one or more physical components, such as hardware controllers, state machines, logic circuits, one or more other structures, or a combination thereof, to enable the data storage device 102 to perform one or more operations described herein.

Alternatively or in addition, one or more aspects of the data storage device 102 may be implemented using a microprocessor or microcontroller programmed (e.g., by executing instructions) to perform operations described herein, such as one or more operations of the method 500 of FIG. 5. In a particular embodiment, the data storage device 102 includes a processor executing instructions (e.g., firmware) retrieved from the memory 104. Alternatively or in addition, instructions that are executed by the processor may be retrieved from a separate memory location that is not part of the memory 104, such as at a read-only memory (ROM).

To further illustrate, the controller 130 may include a processor that is configured to execute instructions to perform certain operations described herein. For example, the processor may include one or more execution units that are operable to execute the instructions. The processor may execute the instructions to perform all or a portion of one or more operations described herein, such as the method 500 of FIG. 5.

It should be appreciated that one or more operations described herein as being performed by the controller 130 may be performed at the memory 104, and vice versa. As an illustrative example, "in-memory" ECC operations, including LLR determination, may be performed at the memory die 103, alternatively or in addition to performing such operations at the controller 130.

The data storage device 102 may be attached to or embedded within one or more host devices, such as within a housing of a host communication device (e.g., the host device 154). For example, the data storage device 102 may be integrated within an apparatus such as a mobile telephone, a computer (e.g., a laptop, a tablet, or a notebook computer), a music player, a video player, a gaming device or console, an electronic book reader, a personal digital assistant (PDA), a portable navigation device, or other device that uses internal non-volatile memory. However, in other embodiments, the data storage device 102 may be implemented in a portable device configured to be selectively coupled to one or more external devices, such as the host device 154.

To further illustrate, the data storage device 102 may be configured to be coupled to the host device 154 as embedded memory, such as in connection with an embedded Multi-Media Card (eMMC®) (trademark of JEDEC Solid State Technology Association, Arlington, Va.) configuration, as an illustrative example. The data storage device 102 may correspond to an eMMC (embedded MultiMedia Card) device. As another example, the host device 154 may be an enterprise device and the data storage device 102 may be configured to be removably coupled to the host device 154 (e.g., in accordance with a blade or modular storage architecture). To illustrate, the data storage device 102 may be part of an enterprise storage server or service, a network-accessible cloud storage server or service, etc. As yet another example, the data storage device 102 may correspond to a memory card, such as a Secure Digital (SD®) card, a microSD® card, a miniSD™ card (trademarks of SD-3C LLC, Wilmington, Del.), a MultiMediaCard™ (MMC™) card (trademark of JEDEC Solid State Technology Association, Arlington, Va.), or a CompactFlash® (CF) card (trademark of SanDisk Corporation, Milpitas, Calif.). The data storage device 102 may operate in compliance with a JEDEC industry specification. For example, the data storage device 102 may operate in compliance with a JEDEC eMMC specification, a JEDEC Universal Flash Storage (UFS) specification, one or more other specifications, or a combination thereof.

The memory 104 may include a three-dimensional (3D) or two-dimensional (2D) memory, a flash memory (e.g., a NAND memory or a NOR memory) a single-level cell (SLC) memory, a multi-level cell (MLC) memory, a divided bit-line NOR (DINOR) memory, an AND memory, a high capacitive coupling ratio (HiCR) device, an asymmetrical contactless transistor (ACT) device, or another flash memory), an erasable programmable read-only memory (EPROM), an electrically-erasable programmable read-only memory (EEPROM), a read-only memory (ROM), a one-time programmable memory (OTP), a resistive random access memory (ReRAM), or any combination thereof. Alternatively or in addition, the memory 104 may include another type of memory. The memory 104 may include a semiconductor memory device.

Semiconductor memory devices include volatile memory devices, such as dynamic random access memory ("DRAM") or static random access memory ("SRAM") devices, non-volatile memory devices, such as resistive random access memory ("ReRAM"), electrically erasable programmable read only memory ("EEPROM"), flash memory (which can also be considered a subset of EEPROM), ferroelectric random access memory ("FRAM"), magnetoresistive random access memory ("MRAM"), and other semiconductor elements capable of storing information. Each type of memory device may have different configurations. For example, flash memory devices may be configured in a NAND or a NOR configuration.

The memory devices can be formed from passive and/or active elements, in any combinations. By way of non-limiting example, passive semiconductor memory elements include ReRAM device elements, which in some embodiments include a resistivity switching storage element, such as an anti-fuse, phase change material, etc., and optionally a steering element, such as a diode, etc. Further by way of non-limiting example, active semiconductor memory elements include EEPROM and flash memory device elements, which in some embodiments include elements containing a charge storage region, such as a floating gate, conductive nanoparticles, or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND memory array may be configured so that the array is composed of multiple strings of memory in which a string is composed of multiple memory elements sharing a single bit line and accessed as a group. Alternatively, memory elements may be configured so that each element is individually accessible, e.g., a NOR memory array. NAND and NOR memory configurations are exemplary, and memory elements may be otherwise configured.

The semiconductor memory elements located within and/or over a substrate may be arranged in two or three dimensions, such as a two dimensional memory structure or a three dimensional memory structure. In a two dimensional memory structure, the semiconductor memory elements are arranged in a single plane or a single memory device level. Typically, in a two dimensional memory structure, memory elements are arranged in a plane (e.g., in an x-z direction plane) which extends substantially parallel to a major surface of a substrate that supports the memory elements. The substrate may be a wafer over or in which the layer of the memory elements are formed or it may be a carrier substrate which is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and word lines.

A three dimensional memory array is arranged so that memory elements occupy multiple planes or multiple memory device levels, thereby forming a structure in three dimensions (i.e., in the x, y and z directions, where the y direction is substantially perpendicular and the x and z directions are substantially parallel to the major surface of the substrate). As a non-limiting example, a three dimensional memory structure may be vertically arranged as a stack of multiple two dimensional memory device levels. As another non-limiting example, a three dimensional memory array may be arranged as multiple vertical columns (e.g., columns extending substantially perpendicular to the major surface of the substrate, i.e., in the y direction) with each column having multiple memory elements in each column. The columns may be arranged in a two dimensional configuration, e.g., in an x-z plane, resulting in a three dimensional arrangement of memory elements with elements on multiple vertically stacked memory planes. Other configurations of memory elements in three dimensions can also constitute a three dimensional memory array.

By way of non-limiting example, in a three dimensional NAND memory array, the memory elements may be coupled together to form a NAND string within a single horizontal (e.g., x-z) memory device levels. Alternatively, the memory elements may be coupled together to form a vertical NAND string that traverses across multiple horizontal memory device levels. Other three dimensional configurations can be envisioned wherein some NAND strings contain memory elements in a single memory level while other strings contain memory elements which span through multiple memory levels. Three dimensional memory arrays may also be designed in a NOR configuration and in a ReRAM configuration.

Typically, in a monolithic three dimensional memory array, one or more memory device levels are formed above a single substrate. Optionally, the monolithic three dimensional memory array may also have one or more memory layers at least partially within the single substrate. As a non-limiting example, the substrate may include a semiconductor such as silicon. In a monolithic three dimensional array, the layers constituting each memory device level of the array are typically formed on the layers of the underlying memory device levels of the array. However, layers of adjacent memory device levels of a monolithic three dimensional memory array may be shared or have intervening layers between memory device levels.

Alternatively, two dimensional arrays may be formed separately and then packaged together to form a non-monolithic memory device having multiple layers of memory. For example, non-monolithic stacked memories can be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic three dimensional memory arrays. Further, multiple two dimensional memory arrays or three dimensional memory arrays (monolithic or non-monolithic) may be formed on separate chips and then packaged together to form a stacked-chip memory device.

Associated circuitry is typically required for operation of the memory elements and for communication with the memory elements. As non-limiting examples, memory devices may have circuitry used for controlling and driving memory elements to accomplish functions such as programming and reading. This associated circuitry may be on the same substrate as the memory elements and/or on a separate substrate. For example, a controller for memory read-write operations may be located on a separate controller chip and/or on the same substrate as the memory elements.

One of skill in the art will recognize that this disclosure is not limited to the two dimensional and three dimensional exemplary structures described but cover all relevant memory structures within the spirit and scope of the disclosure as described herein and as understood by one of skill in the art. The illustrations of the embodiments described herein are intended to provide a general understanding of the various embodiments. Other embodiments may be utilized and derived from the disclosure, such that structural and logical substitutions and changes may be made without departing from the scope of the disclosure. This disclosure is intended to cover any and all subsequent adaptations or variations of various embodiments. Those of skill in the art will recognize that such modifications are within the scope of the present disclosure.

The above-disclosed subject matter is to be considered illustrative, and not restrictive, and the appended claims are intended to cover all such modifications, enhancements, and other embodiments, that fall within the scope of the present disclosure. Thus, to the maximum extent allowed by law, the scope of the present disclosure is to be determined by the broadest permissible interpretation of the following claims and their equivalents, and shall not be restricted or limited by the foregoing detailed description.

What is claimed is:

1. A method comprising:
   at a data storage device that includes a resistive memory:
      performing a first read operation with respect to a storage element of the resistive memory to determine a first read bit value of the storage element, wherein performing the first read operation comprises applying a first read voltage having a first polarity;

performing a second read operation with respect to the storage element to determine a second read bit value of the storage element, wherein performing the second read operation comprises applying a second read voltage having a second polarity opposite the first polarity; and determining read confidence information associated with the storage element based on at least one of the first read operation or the second read operation, wherein the first read voltage having the first polarity comprises a positive read voltage, and wherein the second read voltage having the second polarity comprises a negative read voltage.

2. The method of claim 1, wherein the second read operation is performed in response to determining that a number of read errors associated with the resistive memory exceeds a first threshold or in response to determining that a number of program/erase cycles associated with the resistive memory exceeds a second threshold.

3. The method of claim 1, wherein the read confidence information is determined at a memory die that includes the resistive memory and wherein the read confidence information is provided to a controller of the data storage device.

4. The method of claim 1, wherein the first read bit value and the second read bit value are provided from a memory die that includes the resistive memory to a controller of the data storage device, and wherein the read confidence information is determined at the controller.

5. The method of claim 1, wherein the first read bit value comprises a first hard bit value, wherein the second read bit value comprises a second hard bit value, and wherein the read confidence information comprises at least one soft bit value.

6. The method of claim 5, wherein the at least one soft bit value indicates whether the first hard bit value matches the second hard bit value.

7. The method of claim 5, further comprising:

detecting a property of the storage element, wherein the property corresponds to a current through the storage element or corresponds to a resistance of the storage element, wherein the first hard bit value indicates whether the property exceeds a first threshold, wherein a first soft bit value indicates whether the property exceeds a second threshold that is less than the first threshold, and wherein a second soft bit value indicates whether the property exceeds a third threshold that is greater than the first threshold.

8. The method of claim 7, wherein the first threshold corresponds to a midpoint between an ERASE state curve of the data storage device and an A state curve of the data storage device, wherein the second threshold is within the ERASE state curve and wherein the third threshold is within the A state curve.

9. The method of claim 1, wherein the resistive memory comprises a resistive random access memory (ReRAM).

10. The method of claim 1, wherein the resistive memory has a three-dimensional (3D) memory configuration.

11. The method of claim 10, wherein the 3D memory configuration is monolithically formed in one or more physical levels of arrays of memory cells having an active area above a silicon substrate, and wherein the data storage device further includes circuitry associated with operation of the memory cells.

12. A device comprising:

a memory die including a resistive memory and read/write circuitry, wherein the resistive memory includes a plurality of storage elements that stores a representation of an error correction code (ECC) codeword, wherein the read/write circuitry is configured to determine first hard bit values of the plurality of storage elements using a first read voltage having a first polarity and to determine second hard bit values of the plurality of storage elements using a second read voltage having a second polarity; and a controller coupled to the memory die, wherein the controller is configured to correct at least one bit error in the representation of the ECC codeword, wherein the first read voltage having the first polarity comprises a positive read voltage, and wherein the second read voltage having the second polarity comprises a negative read voltage.

13. The device of claim 12, wherein the controller is configured to determine log likelihood ratio (LLR) values corresponding to the plurality of storage elements based on soft bit values corresponding to the plurality of storage elements, wherein the LLR values are used to correct the at least one bit error.

14. The device of claim 12, wherein the resistive memory has a three-dimensional (3D) memory configuration.

15. The device of claim 14, wherein the 3D memory configuration is monolithically formed in one or more physical levels of arrays of memory cells having an active area above a silicon substrate, and wherein the memory die further includes circuitry associated with operation of the memory cells.

16. A device comprising:

a memory die including a resistive memory and read/write circuitry, wherein the read/write circuitry is configured to determine a first hard bit value of a storage element of the resistive memory using a first read voltage having a first polarity and to determine a second hard bit value of the storage element using a second read voltage having a second polarity; and a controller coupled to the memory die, wherein the controller is configured to perform error correction with respect to data read from the resistive memory, wherein the first read voltage having the first polarity comprises a positive read voltage, and wherein the second read voltage having the second polarity comprises a negative read voltage.

17. The device of claim 16, wherein the memory die includes circuitry configured to generate one or more soft bit values and to provide the one or more soft bit values to the controller.

18. The device of claim 16, wherein the controller is further configured to generate one or more soft bit values corresponding to the storage element.

19. The method of claim 1, wherein a magnitude of the first read voltage is equal to a magnitude of the second read voltage.

20. The method of claim 1, wherein a magnitude of the first read voltage is different from a magnitude of the second read voltage.

* * * * *